Sept. 16, 1969 P. BLUME 3,467,894

ELECTRONIC SWITCH FOR THE RAPID SWITCHING OFF AND ON AGAIN OF CURRENT-CONVEYING COILS

Filed Jan. 14, 1966

INVENTOR.
PETER BLUME
BY
Frank R. [signature]
AGENT

United States Patent Office 3,467,894

Patented Sept. 16, 1969

3,467,894

ELECTRONIC SWITCH FOR THE RAPID SWITCHING OFF AND ON AGAIN OF CURRENT-CONVEYING COILS

Peter Blume, Hamburg-Lurup, Germany, assignor, by mesne assignments, to U.S. Philips Corporation, New York, N.Y., a corporation of Delaware Filed Jan. 14, 1966, Ser. No. 520,563
Claims priority, application Germany, Jan. 21, 1965, P 35,915
Int. Cl. H01h 47/22
U.S. Cl. 317—123 8 Claims

ABSTRACT OF THE DISCLOSURE

A circuit for switching current in an inductor comprises a source of DC voltage, a switch, and a first diode connected in series with the inductor. A capacitor and a second diode are serially connected across the series combination of the inductor and the first diode so that the energy stored in the inductor can be transferred to the capacitor when the switch is opened. A thyristor is shunted across the series combination of the first diode and the capacitor and is poled to discharge the capacitor into the inductor with the same polarity as the voltage source.

The invention relates to an electronic switch for rapidly switching current off and on in current-conveying coils, for example, in electromagnets. More particularly, the invention relates to a circuit for switching current in an inductive load and which includes means for recovering a portion of the energy stored in said inductive load. An electromagnet must be constantly energized at a low voltage and with low power by means of a constant current. The magnet must be switched off periodically during a short time interval (rest time) of, for example, 1 to 2 msec., and then must be switched on again shortly afterwards. In relation to the rest time, the periods of switching on and off must be as small as possible, that is to say, in accordance with the value of the coil, not more than 50 to 200 $\mu$s.

This requires an electronic switching amplifier which is capable of switching a large power since, as is known, with sinusoidal variation of current and voltage, the switching time $t_s$ is given by:

$$t_s=\frac{\pi W_s}{N}$$

wherein $W_s$ is the energy to be supplied and dissipated respectively, and N the maximum power which the electronic switch can switch.

Circuit arrangements for rapidly switching current on and off in coils are already known. The characteristic features of these circuit arrangements is that the magnetic energy in the coil is dissipated in ohmic resistances at every switching operation. In addition, to achieve short switching times, high voltages are required. With respect to the usual switches, the switch according to the invention provides means for recovering a portion of the magnetic field energy. As a result, a considerably smaller amount of energy is lost so that the size of the power supply can be reduced. Said switch is characterized in that a capacitor is connected in parallel with the coil through diodes and that at least the branch of the parallel circuit constituted by the diode, which does not directly follow upon the switch, and by the capacitor is shunted by a thyristor. The electronic switch according to the invention distinguishes itself by particularly short switching times. A voltage source of very small voltage is sufficient for the connection to the supply voltage source.

In order that the invention may readily be carried into effect, it will now be described in greater detail, by way of example, with reference to the accompanying drawing, in which.

Figure 1:
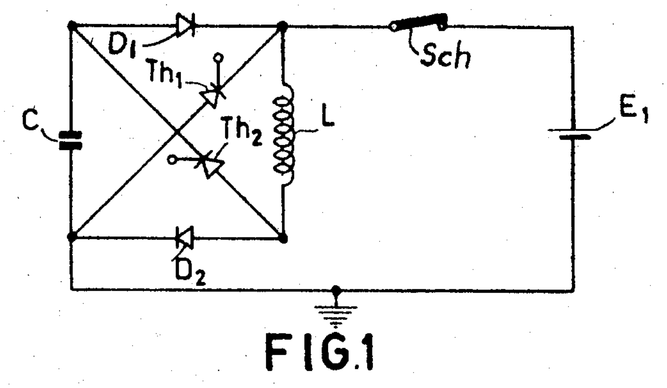
FIGURE 1 is a circuit diagram showing the principle of the switch according to the invention.
Figure 3:
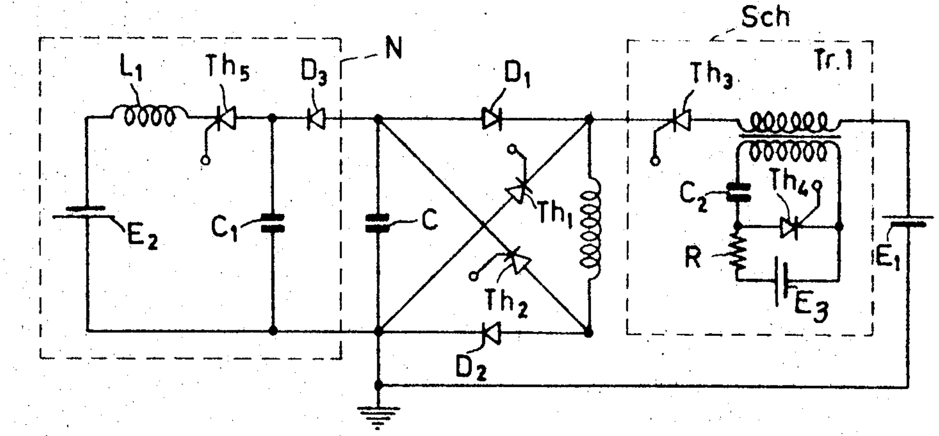

FIGURE 3 shows a complete embodiment of the switch according to the invention. In FIG. 1, an operating current supplied by a source $E_1$ is applied via the closed switch *Sch* to the coil L of an electromagnet and returned to the source through a diode D2. The recovery of the energy is effected by transferring the magnetic energy in the coil of the electromagnet to the capacitor C where it is stored during the energization pause. Via the diodes D1 and D2, the capacitor C is connected parallel to the coil L. The terminals of the coil and the terminals of the capacitor are connected together through thyristors $Th_1$ and $Th_2$ in a type of bridge circuit. The operation of the switch during a switching operation is as follows:

The operating current is switched off by opening the switch *Sch*. For the time being the current flows in the oscillatory circuit constituted by the coil L, the capacitor C and the two diodes D1 and D2, thereby charging the capacitor C. After a period $$T/4=\frac{\pi}{2}\sqrt{LC}$$

the voltage across the capacitor C reaches the maximum value $$U=\sqrt{\frac{L}{C}}J$$

and the magnetic energy $W=\frac{1}{2}LJ^2$ is converted into electrical energy, $W=\frac{1}{2}CU^2$, while the current J through the coil L has decreased to zero. The capacitor C ensures that the voltage at the instant of switching off is very small so that the switch *Sch* can switch off in a condition in which substantially no voltage is applied. After the maximum voltage across the capacitor is reached, a rest period occurs since the diodes D1 and D2 prevent a discharge of the capacitor C. During the rest period, the coil L conveys no current and during this period no magnetic field is produced. The capacitor C remains charged up to the maximum voltage.

The switching-on again of the coil L is effected by igniting the thyristors $Th_1$ and $Th_2$. The capacitor voltage $$U=\sqrt{\frac{L}{C}}J$$

is applied to the coil by the thyristors with reversed polarity and the current in the coil L increases in the same direction as the operating current. When the capacitor C is discharged, the current J again reaches a maximum value which, as a result of losses, is somewhat smaller than the value of the operating current. After the discharge of the capacitor C, the current decreases with the time constant $r=L/RD$ (RD=resistance of the thyristors in the pass direction plus the resistance of the lines).

When the switch *Sch* is closed and the operating current is again supplied to the coil by the voltage source $E_1$, the thyristors are cut off and after a short period of time the initial condition is established once again.

Figure 2:
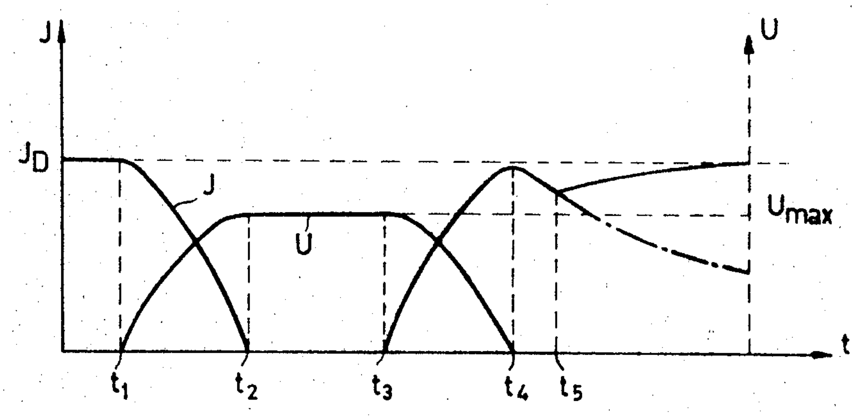
FIGURE 2 shows current and voltages time diagrams.

FIGURE 2 shows the current and the voltage in the circuit as a function of time.

Up to the instant $t_1$ the current is equal to the operating current $J_D$ and the voltage is equal to zero. At the instant $t_1$ the switch *Sch* is opened. The current now decreases cosinusoidally to the value zero, while the voltage increases sinusoidally to the value $U_{max}$. At the instant $t_2$ the current becomes zero. The rest period lies between the instances $t_2$ and $t_3$. At the instant $t_3$ the thyristors are ignited, the current increases sinusoidally, the voltage decreases cosinusoidally and becomes zero at the instant $t_4$. From the instant $t_4$ onwards the current decreases exponentially until the instant $t_5$ at which the switch Sch is closed. The current then increases exponentially with a time constant $\tau = L/R$ to the initial value of the operating current (R=the resistance of the operating current circuit). When the instant $t_5$ and $t_3$ coincide, only the thyristor $Th_2$ is required which does not directly succeed the switch. In the case of large energy losses in the ohmic resistances and in the iron, however, the increase of the current to the nominal value takes too long, so that an additional network N (see FIGURE 3) has to be provided for additionally charging the capacitor. This additional charge is stored in a second capacitor $C_1$ which is connected in parallel to the first capacitor C through a diode D3 (FIGURE 3). Charging the second capacitor takes place in phase 2 (see above). To prevent the charge of the first capacitor C from flowing away, the voltage with which the additional charging takes place must always be smaller than the maximum voltage across said capacitor. The charging of the capacitor C1 is effected in known manner in a series resonant circuit. A coil L1 and a thyristor $Th_5$ are connected in series with the capacitor C1. When the thyristor is ignited a sinusoidal oscillation begins. The voltage of C1 increases from zero to double the value of the voltage of the voltage source E2 which supplies the series arrangement. Since the current would reverse its direction after half a cycle, the thyristor is cut-off so that the capacitor C1 maintains its charge until the capacitor C is discharged through the thyristors $Th_1$ and $Th_2$.

To obtain very short switching times, very high operating voltages are required and thyristors must be used for all the switching functions. In order to switch the operating current on and off, a thyristor $Th_3$ also must be used as a switch Sch owing to the required safety against a voltage breakdown.

In the circuit arrangement shown in FIGURE 3, the switching off of the thyristor $Th_3$ takes place in known manner by setting up a negative voltage at the anode. Since only a short voltage pulse with a duration of approximately 30 to 50 $\mu$s. is required, said pulse is injected through a transformer $Tr_1$ with very low mutual inductance. The voltage pulse is also produced with a thyristor circuit including a capacitor C2 that is connected to the transformer through a thyristor $Th_4$. The thyristor extinguishes automatically. The capacitor C2 is charged by a voltage source E3 through a resistor R.

What is claimed is:

1. An electronic switch for rapidly switching the current in a coil comprising, a source of voltage, a switch interconnecting said voltage source and said coil, a pair of diodes, a capacitor connected in parallel with the coil by means of said diodes, a thyristor, means connecting said thyristor in shunt with that branch of the parallel arrangement which is constituted by the diode which does not directly follow upon the switch and by the capacitor.

2. A circuit for switching current in an inductor comprising, a source of voltage, switch means, a first diode, means connecting said voltage source, said switch means, said inductor and said first diode in series circuit, a capacitor, a second diode, means serially connecting said capacitor and said second diode across the series combination of said inductor and said first diode to form a closed loop circuit, said diodes being poled with like polarity so that energy stored in said inductor can be transferred to said capacitor when said switch means is opened, and a controlled rectifier connected in shunt with the series combination of said first diode and said capacitor and poled so as to discharge said capacitor into said inductor with the same polarity as the voltage source.

3. A circuit as described in claim 2 further comprising rectifier means connected in shunt with the series combination of said inductor and said first diode and poled to conduct current in the same direction as said controlled rectifier.

4. A circuit as described in claim 2 further comprising, a second capacitor, a third diode, means serially connecting said third diode and said second capacitor in parallel with said first capacitor, and a resonant charging circuit for said second capacitor comprising, in series across said second capacitor, a second controlled rectifier, a second inductor, and a voltage source.

5. A circuit as described in claim 2 wherein said switch means comprises, a second controlled rectifier, a transformer having first and second windings, a second capacitor, means for charging said second capacitor, means for rapidly discharging said second capacitor via said first winding, and means connecting said second winding in series with said second controlled rectifier and said inductor.

6. A circuit for switching current in an inductor comprising, first and second diodes, a capacitor, means serially connecting said inductor, said first diode, said capacitor, and said second diode, in that order, to form a closed loop circuit, said diodes being poled to allow current to flow in one direction in said closed loop circuit, switch means, a source of direct voltage, means serially connecting said switch means and said voltage source across one pair of opposed terminals of said closed loop circuit, first and second rectifier means, and means connecting said first rectifier means across said one pair of terminals and said second rectifier means across the other pair of opposed terminals of said closed loop circuit.

7. A circuit as described in claim 6 wherein said first and second rectifier means comprise first and second semiconductor controlled rectifiers, respectively.

8. A circuit as described in claim 6 wherein said one pair of terminals comprise the common junction between said inductor and said second diode and the common junction between said first diode and said capacitor, and said other pair of terminals comprise the common junction between said inductor and said first diode and the common junction between said capacitor and said second diode.

References Cited

UNITED STATES PATENTS 3,158,791 11/1964 Deneen et al. ______ 317—148.5

LEE T. HIX, Primary Examiner

U.S. Cl. X.R.

317—148.5